US008841905B2

(12) United States Patent (10) Patent No.: US 8,841,905 B2
Yuan (45) Date of Patent: Sep. 23, 2014

(54) SYSTEM AND METHOD FOR FIBER MAGNETO-OPTIC DETECTION

(75) Inventor: Haijun Yuan, Pudong New Area (CN)

(73) Assignee: 3S Hi-Technologies Co., Ltd., Pudong New Area (CN)

( * ) Notice: Subject to any disclaimer, the term of this patent is extended or adjusted under 35 U.S.C. 154(b) by 219 days.

(21) Appl. No.: 13/519,860

(22) PCT Filed: Nov. 22, 2010

(86) PCT No.: PCT/CN2010/078969
§ 371 (c)(1), (2), (4) Date: Jun. 28, 2012

(87) PCT Pub. No.: WO2011/079664
PCT Pub. Date: Jul. 7, 2011

(65) Prior Publication Data
US 2012/0286775 A1 Nov. 15, 2012

(30) Foreign Application Priority Data

Dec. 31, 2009 (CN) .......................... 2009 1 0202165

(51) Int. Cl.
G01R 33/02 (2006.01)
G01R 33/032 (2006.01)
G01R 33/00 (2006.01)
G01R 31/00 (2006.01)
G01R 15/24 (2006.01)

(52) U.S. Cl.
CPC .......... G01R 33/032 (2013.01); G01R 33/0041 (2013.01); G01R 15/246 (2013.01)
USPC ........................... 324/244.1; 324/244; 324/96

(58) Field of Classification Search
CPC ............. G01R 15/246; G01R 33/0322; G01R 33/032; G01R 15/24; G01R 15/245; G01R 19/00; G01D 5/145; G02F 1/09; H01P 1/175
USPC ...................... 324/76.11–76.83, 96, 244, 260; 250/225, 231 R; 359/7, 8, 280, 281, 359/283, 576
See application file for complete search history.

(56) References Cited

U.S. PATENT DOCUMENTS 4,539,521 A * 9/1985 Matsumoto ................ 324/244.1
4,956,607 A 9/1990 Abe et al.
2011/0267049 A1* 11/2011 Yuan .......................... 324/244.1

FOREIGN PATENT DOCUMENTS

| CN | 101509962 | 8/2009 |
|---|---|---|
| CN | 101762795 | 6/2010 |
| CN | 101769999 | 7/2010 |
| JP | 2002236159 | 8/2002 |
| JP | 2003255031 | 9/2003 |

OTHER PUBLICATIONS

International Search Report for corresponding Application No. PCT/CN2010/078969, dated Jul. 7, 2011 (7 pgs.).

* cited by examiner

Primary Examiner — Jermele M Hollington
Assistant Examiner — Raul Rios Russo
(74) Attorney, Agent, or Firm — Shumaker & Sieffert, P.A.

(57) ABSTRACT

A system and method for fiber magneto-optic detection are provided, which belongs to the optical application field. The system comprises: a reference device (300) for generating a reference magnetic field signal with known amplitude and shape at a measurement point; a magneto-optic probe (100) for detecting a magnetic field signal of the measuring point, converting the magnetic field signal into an optical signal, and transmitting to a power supply and signal processing module (400) the optical signal sent by the magneto-optic probe; the power supply and signal processing module (400) for transmitting laser light, and converting the optical signal into an electrical signal after receiving it, and demodulating and analyzing the electric signal to acquire the magnetic field information and/or the current information of the measuring point. The reference device (300) is provided in the system, and the measured signals can be corrected by the reference magnetic field signal generated by the reference device (300) to remove the influences environment factors cause on the measurement. Thus accurate measurement data are acquired and the measurement accuracy of the system is improved.

8 Claims, 4 Drawing Sheets

SYSTEM AND METHOD FOR FIBER MAGNETO-OPTIC DETECTION

FIELD OF THE INVENTION

The invention relates to the field of optical application, particularly to a fiber magneto-optic detection system and method thereof.

BACKGROUND

Magneto-optic effects such as Faraday Effect are popularly used in measurement of the electrical current or magnetic field. Magneto-optic glass, magneto-optic crystal or fiber etc. is usually used for achieving Faraday Effect.

As shown in FIG. 1, a fiber magneto-optic detection system in the prior art is shown comprising a power supply and signal processing module 400, a magneto-optic probe 100 and a conductive fiber device 200. The power supply and signal processing module 400 emits laser light which is transmitted to the magneto-optic probe 100 through the fiber device 200. The magneto-optic probe is designed to sense the magnetic field of the environment in which the magneto-optic probe 100 is located, based on a certain optical principle such as Faraday Effect, and convert the magnetic field signal into optical signal. The optical signal is carried by the laser light and transmitted back to the power supply and signal processing module 400 via the fiber device 200. The power supply and signal processing module 400 performs data processing based on the optical signal received, so as to obtain information on the magnetic field of the measurement point.

During the measurement process shown in FIG. 1, various materials and optical structures may be affected by the environmental factors such as temperature and stress or the intensity of the magnetic field to be measured. These affections cause the inaccuracy in measurement, such that the precision of measurement may not meet the application requirement.

The inventor recognizes in developing the invention that various materials used in the magneto-optic measurement are always affected by the environmental factors such as temperature, stress or the intensity of the magnetic field to be measured, which will cause improper measurement. Especially, the inventor recognizes that when some material such as garnet crystal is used as a magneto-optic medium to measure the magnetic field, the microcosmic structure of magnetic domains inside the garnet crystal changes unpredictably when the crystal is subjected to a certain intensity of direct-current or alternating magnetic field, which affects the optical characteristics and leads to uncertain measurement results. In the art, there is no reasonable solution for resolving such problems.

SUMMARY OF THE INVENTION

The present invention aims to provide a fiber magneto-optic detection system and method thereof, which utilizes a real-time correction mode to eliminate the influence of the environmental factors so as to obtain proper measurement data, etc.

In one aspect of the present invention, one embodiment of the present application provides a fiber magneto-optic detection system comprising:

a reference device for generating a reference magnetic field signal with known amplitude and shape at a measurement point;

a magneto-optic probe for detecting magnetic field signal at the measurement point and converting the magnetic field signal into optical signal, in which the optical signal is carried by the received laser light for transmission and in which the magnetic field signal is superposition of the reference magnetic field signal and the magnetic field signal generated at the measurement point itself;

a fiber device for conveying laser light and transmitting the optical signal sent by the magneto-optic probe and carried by the laser light to a power supply and signal processing module; and the power supply and signal processing module for emitting laser light, converting the optical signal into electric signal after receiving the optical signal, and demodulating and analysis the electric signal based on the reference magnetic field signal, so as to obtain the magnetic field information and/or current information of the measurement point itself.

In another aspect of the present invention, a further embodiment of the present invention provides a method for fiber magneto-optic measurement comprising:

a reference device generating a reference magnetic field signal with a given amplitude and shape at the measurement point;

a magneto-optic probe detecting magnetic field signal of the measurement point, converting the magnetic field signal into optical signal and transmitting the optical signal by carrying the optical signal on laser light, in which the magnetic field signal is superposition of the reference magnetic field signal and the magnetic field signal generated at the measurement point itself;

a fiber device transmitting to a power supply and signal processing module the optical signal transmitted by the magneto-optic probe and carried by the laser light; and the power supply and signal processing module receiving the optical signal, then converting the optical signal into electric signal, and performing demodulation and analysis on the electric signal based on the reference magnetic field signal so as to obtain the magnetic field information and/or current information of the measurement point itself.

According to the present invention, a reference device is provided in the measurement system. By virtue of the reference magnetic field signal generated by the reference device, the measured signals can be corrected so as to eliminate the influence on measurement caused by the environmental factors and to obtain proper measurement data, improving the measurement precision of the system.

BRIEF DESCRIPTION OF THE DRAWINGS

The drawings form a part of the description and are provided for further understanding of the disclosure. The exemplary embodiments of the disclosure and the description thereof are used for explaining the present disclosure and are not intend to limit the present disclosure. In the drawings.

DETAILED DESCRIPTION

The present invention will be illustrated in detail with reference to the drawings in combination with the embodiments.

Embodiment 1

Figure 1:
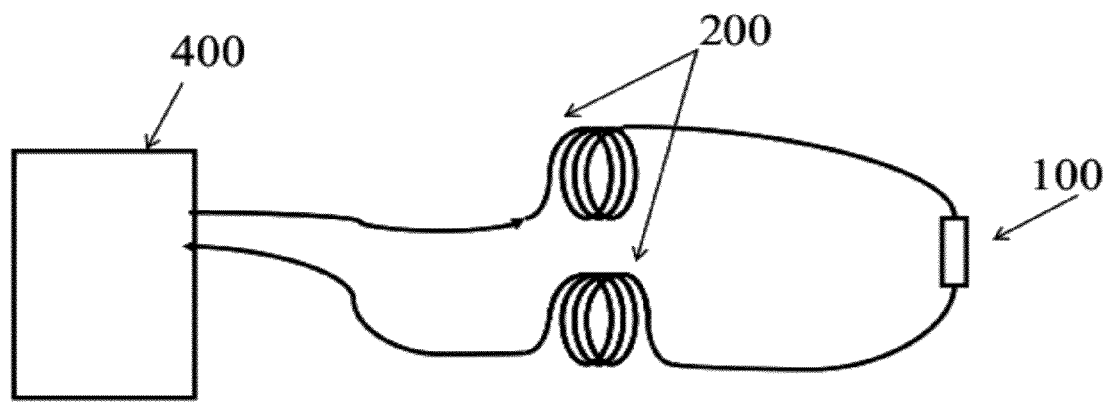
FIG. 1 illustrates a structural block diagram of an existing fiber magneto-optic detection system.
Figure 2:
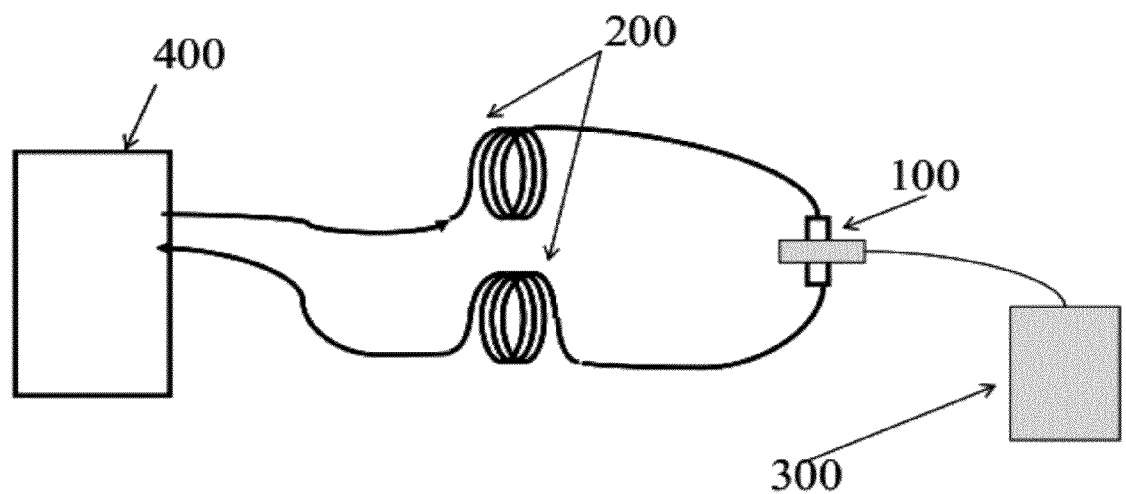
FIG. 2 illustrates a structural block diagram of a fiber magneto-optic detection system according to Embodiment 1 of the present invention.

As shown in FIG. 2, the present embodiment provides a fiber magneto-optic detection system comprising: a magneto-optic probe 100, a fiber device 200, a reference device 300 and a power supply and signal processing module 400, in which the magneto-optic probe 100 and the reference device 300 are placed around a measurement point which may be located with a high electric potential, the power supply and signal processing module 400 is placed with a safe zero or low electric potential, and an insulated conductive fiber device 200 connects them.

The reference device 300 is used for generating a reference magnetic field at the measurement point with known amplitude and shape.

The magneto-optic probe 100 is used for detecting magnetic field signal at the measurement point and converting the magnetic field signal into optical signal which is carried by the received laser light for transmission and in which the magnetic field signal is superposition of the reference magnetic field signal and the magnetic field signal generated at the measurement point itself.

The fiber device 200 is used for conveying laser light and transmitting the optical signal, sent from the magneto-optic probe 100 and carried by the laser light, to the power supply and signal processing module 400.

The power supply and signal processing module 400 is used for emitting laser light, converting the received optical signal into electric signal, and conducting demodulation and analysis on the electric signal based on the reference magnetic field signal so as to obtain the magnetic field information and/or current information of the measurement point itself. The magnetic field signal generated by the reference device 300 does not vary due to the environmental factors, and the magnetic field signal may be added with the magnetic field signal, and the superposition is sensed by the magneto-optic probe 100 and transmitted to the power supply and signal processing module 400 through the fiber device 200. The power supply and signal processing module 400 demodulate the two sets of signals. Since the signals to be measured and the reference magnetic field signals are detected by the magneto-optic probe 100 through a completely identical path, the influences the environmental factors generate on them are same with each other. Thus, since the reference magnetic field signal is known, the influence caused by the environmental factors may be eliminated by comparison between them, thus obtaining proper measurement data. In the system of the present embodiment, when the magneto-optic probe 100 is placed around the current carrier, the magnetic field can be precisely measured by virtue of the above processes and thus the current can be precisely measured.

According to the present embodiment of the invention, the reference device 300 which can generate reference magnetic field signal with given information is introduced in the fiber magneto-optic detection system. By virtue of the variation of the reference magnetic field signal, the influence caused by the environmental factors to the measured magnetic field signal generated at the measurement point can be eliminated and a proper measurement result can be obtained, thus improving the accuracy of the measurement and ensuring the reliability of the system.

Embodiment 2

Figure 3:
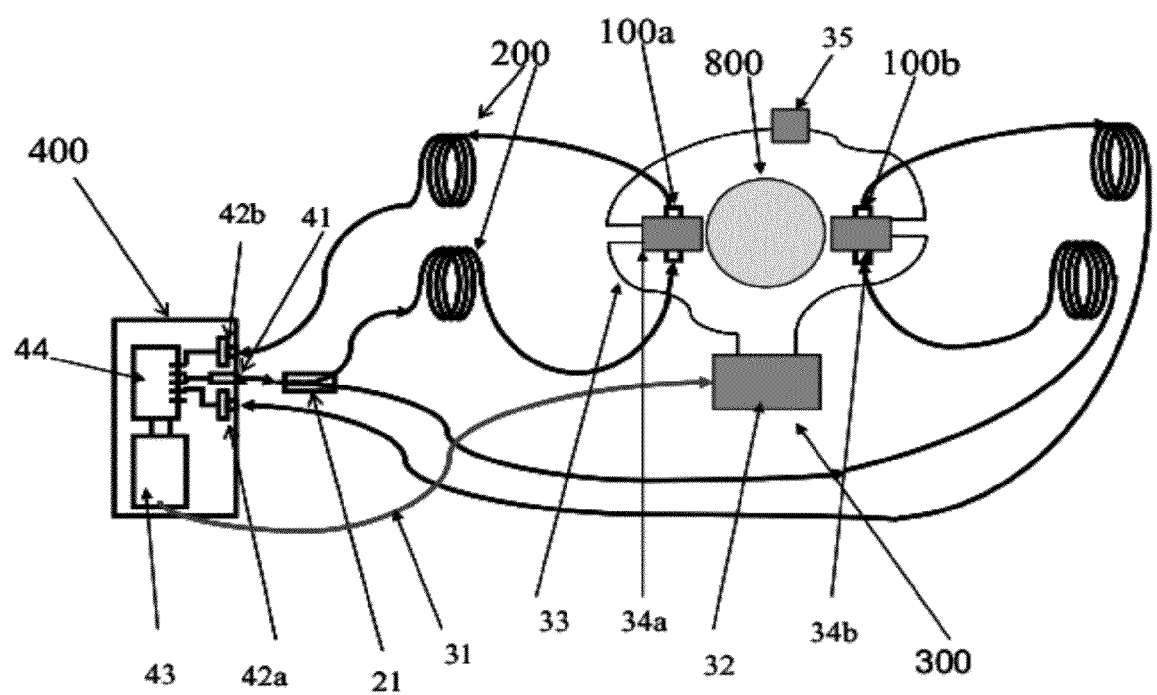
FIG. 3 illustrates a structural block diagram of a fiber magneto-optic detection system according to Embodiment 2 of the present invention.

As shown in FIG. 3, the present embodiment provides a fiber magneto-optic detection system which is similar with that of Embodiment 1 and which comprises a magneto-optic probe 100, a fiber device 200, a reference device 300 and a power supply and signal processing module 400. The magneto-optic probe 100 and the reference device 300 are placed around the measurement point with a high electric potential, the power supply and signal processing module 400 is placed at a position with a safe zero or low electric potential, and the insulated conductive fiber device 200 connects them.

In the system, there are two magneto-optic probe 100, i.e., a first magneto-optic probe 100a and a second magneto-optic probe 100b, which are symmetrically placed at the two sides of the measurement point respectively.

Accordingly, the power supply and signal processing module 400 includes:

a detection laser device 41 for providing laser light signal to the first magneto-optic probe 100a and the second magneto-optic probe 100b through the fiber device 200;

a reference laser device 43 for transmitting a reference laser light signal with a given intensity to the reference device 300 through the fiber device 200 at a given moment;

photoelectric detectors, the number o of which in this embodiment is two, i.e., a photoelectric detector 42a and a photoelectric detector 42b, which are used for receiving optical signals from the magneto-optic probe 100a and the second magneto-optic probe 100b, converting the optical signals into electric signals and transmitting the electric signals; and a control and signal processing module 44, which is used for receiving the electric signals transmitted by the photoelectric detectors 42a and 42b, and demodulating and analyzing the electric signals based on the reference magnetic field signal, thus obtaining the magnetic field information and/or current information of the measurement point itself.

The reference device 300 includes:

an photoelectric conversion module 32, which is used for receiving the reference laser light signal from the power supply and signal processing module 400 through the conductive fiber and converting the reference laser light signal into a current signal for outputting; and a first coil 34a surrounding outside the first magneto-optic probe 100a and a second coil 34b surrounding outside the second magneto-optic probe 100b, in which the first coil 34 and the second coil 34b are connected in serial by a conductive wire and connected to the current output of the optical-electrical converter modular 32 so as to receive the current signal for generating the reference magnetic field signal with known amplitude and shape.

In the present embodiment, the measure source is a current carrier conductor 800, in which the first magneto-optic probe 100a and the second magneto-optic probe 100b are used for sensing the magnetic field generated by the electric current of the current carrier conductor 800 and in which the electric current of the current carrier conductor 800 runs in a direction perpendicular to the paper sheet.\

Preferably, a temperature compensation device 35 is connected between the first coil 34a and the second coil 34b for compensating the resistance drifting of the first coil 34a and the second coil 34b due to the temperature variation.

Preferably, besides a fiber 31 for transmitting signal, the fiber device 200 may further comprise:

an optical splitter 21, which is used for splitting the laser light transmitted by the detection laser device 41 into two paths and transmitting the two paths of laser light to the first magneto-optic probe 100a and the second magneto-optic probe 100b respectively through the fiber 31 such that the optical signals after conversion are carried on the received laser light by the first magneto-optic probe 100a and the second magneto-optic probe 100b return to the power supply and signal processing module 400 the laser light carrying the optical signal of the current carrier conductor 800.

In the present embodiment, the fiber 31 guides the laser light from the power supply and signal processing module 400 into the optical splitter 21 where the laser light is splitted into two beams, and the two beams are transmitted to the first magneto-optic probe 100a and the second magneto-optic probe 100b respectively for sensing the magnetic field, and then transmitted back to the power supply and signal processing module 400 through the fiber 31 for analysis and data process.

In the present embodiment, the photoelectric detector 42a and the photoelectric detector 42b receive respectively optical signals from the first magneto-optic probe 100a and the second magneto-optic probe 100b, convert them into electrical signals which are sent to the control and signal processing module 44, and conduct signal modulation and data analysis. The reference laser device 43 can emit reference laser light with a given intensity at a given moment according to the commands of the control and signal processing unit 44. The given intensity is a predetermined optical intensity which enables the reference device 300 to generate a magnetic field signal with high accuracy and high repeatability.

In the present embodiment, the photoelectric conversion module 32 of the reference device 300 receives the reference optical signal transmitted through the fiber 31 and then converts it into an reference electrical current signal; the first coil 34a, the second coil 34b and the temperature compensation device 35 are connected in serial by conductive wires 33 and then are connected to the electrical current output of the photo-electrical module 32; the first coil 34a is placed outside around the first magneto-optic probe 100a while the second coil 34b is placed outside around the second magneto-optic probe 100b; the photoelectric current generated by the reference laser light signal passes through the first coil 34a and the second coil 34b to generate a known constant reference magnetic field signal; the superposition of the reference magnetic field signal and the magnetic field signals generated at the measurement point itself is detected by the first magneto-optic probe 100a and the second magneto-optic probe 100b; the temperature compensation device 35 is used for compensating the drifting of the reference electric current caused by the resistance variation of the phototube of the coils due to temperature variation.

In the system of the present embodiment, the power supply and signal processing module 400 detects signals which contain both the reference magnetic field and the magnetic field to be measured. Since the reference magnetic field is generated according to the command of the power supply and signal processing module 400, it is easy for the power supply and signal processing module 400 to separate it from the measured signals. Since the reference magnetic field and the magnetic field to be measured are transmitted through a completely identical path, the disturbance is identical, and thus the power supply and signal processing module 400 can eliminate the disturbance signals by comparison and analysis, achieving proper measurement for the electric current of the carrier and improving the accuracy of the measurement.

Embodiment 3

Figure 4:
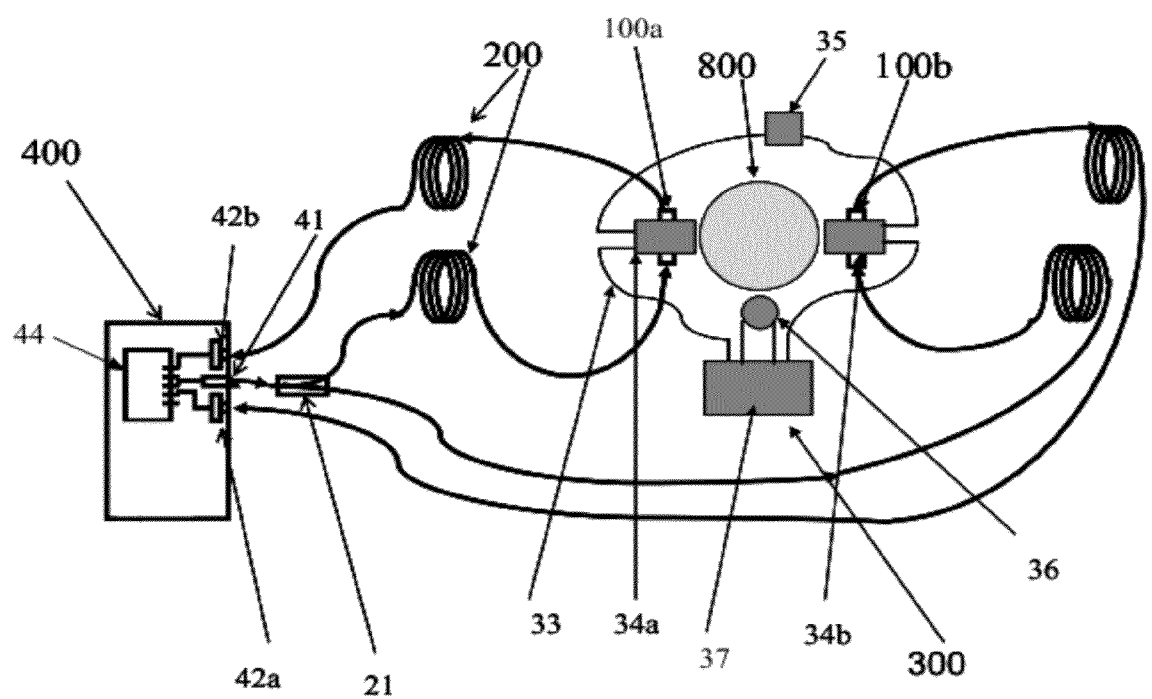
FIG. 4 illustrates a structural block diagram of a fiber magneto-optic detection system according to Embodiment 3 of the present invention.

As shown in FIG. 4, the present embodiment provides a fiber magneto-optic detection system which is similar with that of Embodiment 1 and which comprises a magneto-optic probe 100, a fiber device 200, a reference device 300 and a power supply and signal processing module 400. The magneto-optic probe 100 and the reference device 300 are placed around the measurement point with a high electric potential, the power supply and signal processing module 400 is placed at a position with a safe zero or low electric potential and the insulated conductive fiber device 200 connects them.

Different from that in Embodiment 2, the reference device 300 of the present embodiment includes: a power collection module 36, a reference signal modulating module 37 used to replace the photoelectrical module 32 in FIG. 3, conductive wires 33, a first coil 34a and a second coil 34b, and a temperature compensation device 35. The power collection module 36 collects power with a given magnitude (for example, a small portion) from the carrier to be measured and transfers it to the reference signal modulating module 37. The reference signal modulating module 37 converts such power into a reference electric current which is easy to be demodulated from the measured signals and which has a fixed magnitude. The other parts of the system function in a substantially same way as that of Embodiment 2 and thus the detailed explanation is omitted.

According to Embodiment 3 of the present application, the power supply and signal processing module 400 detects signals containing both the reference magnetic field and the magnetic field to be measured. Since the reference magnetic field is obtained based on the reference electric current demodulated from the power energy collected from the measurement point by the power collection module 35, it is easy for the power supply and signal processing module 400 to separate it from the measured signals. Since the reference magnetic field and the magnetic field to be measured are transmitted through a completely identical path, the disturbance is identical, and thus the power supply and signal processing module 400 can eliminate the disturbance signals by comparison and analysis, achieving proper measurement to the electric current of the carrier and improving the accuracy of the measurement.

Embodiment 4

Figure 5:
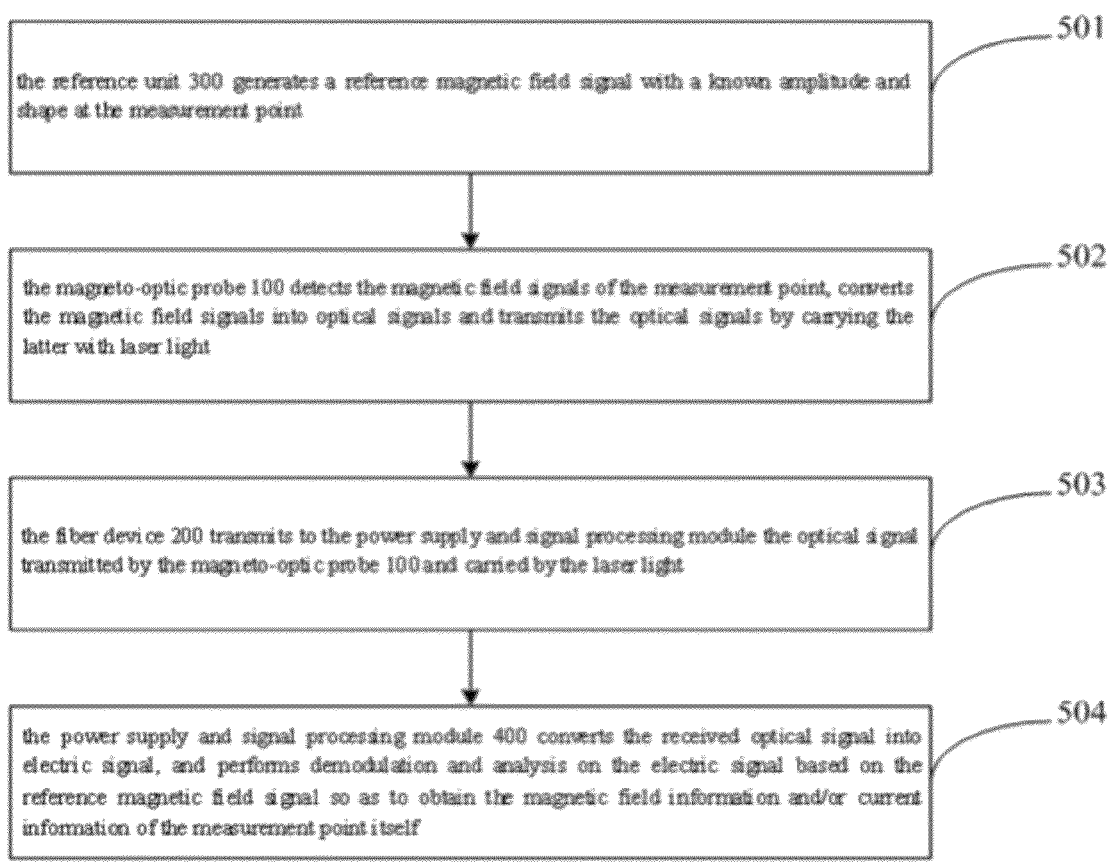
FIG. 5 illustrates a flow chart of a fiber magneto-optic detection method according to Embodiment 4 of the present invention.

As shown in FIG. 5, the present embodiment provides a fiber magneto-optic detection method. Now the method is to be explained with the combination with the system of Embodiment 1 as the example, and the method includes:

Step 501, the reference device 300 generates a reference magnetic field signal with a known amplitude and shape at the measurement point;

Step 502, the magneto-optic probe 100 detects the magnetic field signal of the measurement point, converts the magnetic field signal into optical signal and transmits the optical signal by carrying the latter with laser light, in which the magnetic field signal is superposition of the reference magnetic field signal and the magnetic field signal generated at the measurement point itself;

Step 503, the fiber device 200 transmits to the power supply and signal processing module 400 the optical signal transmitted by the magneto-optic probe 100 and carried by the laser light; and Step 504, the power supply and signal processing module 400 converts the received optical signal into electric signal, and performs demodulation and analysis on the electric signal based on the reference magnetic field signal so as to obtain the magnetic field information and/or current information of the measurement point itself.

In the method of the present embodiment, by virtue of the superposition of the reference magnetic field signal onto the magnetic field signal to be measured, the power supply and signal processing module 400 detects signals containing both the reference magnetic field and the magnetic field to be measured. Since the reference magnetic field is known, it is easy for the power supply and signal processing module 400 to separate it from the measured signals. Since the reference magnetic field and the magnetic field to be measured are transmitted through a completely identical path, the disturbance is identical, and thus the power supply and signal processing module 400 can eliminate the disturbance signals by comparison and analysis, achieving proper measurement to the electric current of the carrier and improving the accuracy of the measurement.

In the embodiments all above, the material in the magneto-optic probe 100 for sensing the magnetic field may be magneto-optic glass, magneto-optic crystal or fiber etc. The number of the magneto-optic probes 100 used for measurement may be singular or plural. One set or more sets of photoelectric detector may be provided in the power supply and signal processing module 400 for detecting the incoming of the optical or electric signals, in which differential technologies may be applied in the photoelectric detectors. All those variations will not baffle the implementation of the systems according to the embodiments. Although the description is given by taking a magneto-optic crystal measurement system as example, various kinds of applications using the concept of the invention will be covered by the scope of the present invention.

From the above description, it may be understood that the above embodiments of the present invention can achieve beneficial technical effects.

Obviously, the skilled in the art may understand that the above mentioned modules and steps may be implemented by a common computing device, and they may be integrated in one single computing device or distributed on the network constituted by several computing devices. Preferably, they may be achieved by the programmable codes executable by a computing device such that they may be stored in a storage means and processed by the computing device. Alternatively, they may be fabricated respectively as several individual integrated circuit modules, or some modules or steps among them may be fabricated as a single integrated circuit module. Therefore, the present invention shall not be limited on any specific superposition of hardware and software.

The above description is only for the preferred embodiments of the present invention and not used for limiting the invention. For one skilled in the art, the present invention may have various modifications and changes. Any modifications, equivalent replacements and improvements made within the spirit and principle of the present invention should be contained within the protection scope of the present invention.

The invention claimed is:

1. A fiber magneto-optic detection system comprising:
   a reference device for generating a reference magnetic field signal with known amplitude and shape at a measurement point;
   a magneto-optic probe for detecting magnetic field signal at the measurement point and converting the magnetic field signal into optical signal, in which the optical signal is carried by the received laser light for transmission and in which the magnetic field signal is superposition of the reference magnetic field signal and the magnetic field signal generated at the measurement point itself;
   a fiber device for conveying laser light and transmitting the optical signal sent by the magneto-optic probe and carried by the laser light to a power supply and signal processing module; and
   the power supply and signal processing module for emitting laser light, converting the optical signal into electric signal after receiving the optical signal, and demodulating and analysis the electric signal based on the reference magnetic field signal, so as to obtain the magnetic field information and/or current information of the measurement point itself.

2. The system according to claim 1, wherein
   the number of the magneto-optic probes is two, which include a first magneto-optic probe and a second magneto-optic probe placed symmetrically at the two sides of the measurement point respectively; and
   the power supply and signal processing module includes correspondingly:
   a detection laser device for emitting laser light to the first magneto-optic probe and the second magneto-optic probe through the fiber device;
   a photoelectric detector for receiving optical signal from the first magneto-optic probe and the second magneto-optic probe and carried by the laser light, converting the optical signal into electric signal and transmitting the electric signal; and
   a control and signal processing module for receiving the electric signal transmitted by the photoelectric detector and demodulating and analyzing the electric signal with reference to the reference magnetic field signal, thus obtaining the magnetic field information and/or current information of the measurement point itself.

3. The system according to claim 2, wherein the power supply and signal processing module comprises:
   a reference laser device for emitting a reference laser light signal with a specific intensity to the reference device through the fiber device at a given moment; and
   the reference device comprises correspondingly:
   an photoelectric conversion module for receiving the reference laser light signal from the power supply and signal processing module through the conductive fiber and converting the reference laser light signal into a current signal for outputting; and
   a first coil surrounding outside the first magneto-optic probe and a second coil surrounding outside the second magneto-optic probe, in which the first coil and the second coil are connected in serial by a conductive wire and connected to the current output end of the optical-electrical converter modular so as to receive the current signal for generating the reference magnetic field signal with known amplitude and shape.

4. The system according to claim 2, wherein the reference device comprises:
   a power collection module for collecting a power with a predetermined magnitude from the measurement point and outputting the collected power;
   a reference signal modulating module for converting the power output from the power collection module into a reference electric current with a known amplitude; and
   a first coil surrounding outside the first magneto-optic probe and a second coil surrounding outside the second magneto-optic probe, in which the first coil and the second coil are connected in serial by a conductive wire and connected to the current output end of the optical-electrical converter modular so as to receive the current signal for generating the reference magnetic field signal with known amplitude and shape.

5. The system according to claim 1, wherein a temperature compensation device is connected between the first coil and the second coil for compensating the resistance drifting of the first coil and the second coil caused by temperature variation.

6. The system according to claim 1, wherein the fiber device comprises:

an optical splitter for splitting the laser light emitted by the detection laser device into two paths and transmitting the two paths of laser light to the first magneto-optic probe and the second magneto-optic probe respectively.

7. The system according to claim 1, wherein the material in the magneto-optic probe for sensing the magnetic field comprises magneto-optic glass, magneto-optical crystal or fiber.

8. A fiber magneto-optic detection system comprising:

a reference device generating a reference magnetic field signal with a given amplitude and shape at the measurement point;

a magneto-optic probe detecting magnetic field signal of the measurement point, converting the magnetic field signal into optical signal and transmitting the optical signal by carrying the optical signal on laser light, in which the magnetic field signal is superposition of the reference magnetic field signal and the magnetic field signal generated at the measurement point itself;

a fiber device transmitting to a power supply and signal processing module the optical signal transmitted by the magneto-optic probe and carried by the laser light; and the power supply and signal processing module receiving the optical signal, then converting the optical signal into electric signal, and performing demodulation and analysis on the electric signal based on the reference magnetic field signal so as to obtain the magnetic field information and/or current information of the measurement point itself.

* * * * *